(12) United States Patent
Wissell

(10) Patent No.: US 7,397,314 B2
(45) Date of Patent: Jul. 8, 2008

(54) REDUNDANT CLOCK SOURCE

(75) Inventor: Daniel Wissell, Acton, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 988 days.

(21) Appl. No.: 10/241,014

(22) Filed: Sep. 11, 2002

(65) Prior Publication Data

US 2004/0046613 A1    Mar. 11, 2004

(51) Int. Cl.
*H03B 1/04* (2006.01)
(52) U.S. Cl. .............................. 331/49; 331/56; 331/77
(58) Field of Classification Search .................... 331/46, 331/49, 56, 74–77
See application file for complete search history.

(56) References Cited

U.S. PATENT DOCUMENTS

| | | | |
|---|---|---|---|
| 3,940,558 A * | 2/1976 | Gabbard et al. ............. | 375/356 |
| 4,748,644 A | 5/1988 | Silver et al. | |
| 5,319,678 A | 6/1994 | Ho et al. | |
| 5,434,520 A | 7/1995 | Yetter et al. | |
| 5,497,128 A * | 3/1996 | Sasaki .......................... | 331/38 |
| 5,625,805 A | 4/1997 | Fenwick et al. | |
| 5,909,472 A | 6/1999 | Arnett | |
| 5,969,558 A * | 10/1999 | Abe ............................ | 327/292 |
| 6,104,251 A | 8/2000 | Ramey et al. | |
| 6,239,387 B1 | 5/2001 | Wissell | |
| 6,311,287 B1 | 10/2001 | Dischler et al. | |
| 6,407,575 B1 | 6/2002 | Wissell et al. | |
| 2004/0046613 A1 * | 3/2004 | Wissell ........................ | 331/46 |

* cited by examiner

Primary Examiner—David Mis

(57) ABSTRACT

A redundant clock source provides a stable clock source for digital system. The clock source uses two oscillators to generate a clock signal. If one of the oscillators fails, the clock signal is generated from the other oscillator until the failed oscillator is replaced. Special filtering of the waveforms produced by the oscillators makes the clock source is resistant to jitter from the oscillators and transients that occur when an oscillator fails. This allows the clock source to not only use a redundant oscillator in an attempt to eliminate a single point of failure, but to also provide a stable clock signal even if one oscillator fails.

14 Claims, 6 Drawing Sheets

REDUNDANT CLOCK SOURCE

BACKGROUND OF THE INVENTION

1. Field of the Invention

This invention is related to a stable, reliable clock source for digital systems. More particularly, it is related to a clock source, comprising multiple oscillators, that continues to provide a stable clock signal if one of the oscillators fails.

2. Background Information

The various circuits of digital data processing systems operate in synchronization with a clock signal that is usually provided by a central (master) clock. Consequently if this clock fails, the entire system will fail. Attempts have been made to provide a master clock comprising multiple oscillators, where, if an oscillator fails, another oscillator will be switched in to provide the clock signal. However, this arrangement also leads to system failure because the switching causes an unacceptable phase change in the clock signal. Specifically, the system will fail if an edge in the master clock signal arrives either too soon or too late.

This invention is directed to the ability to provide a phase-stable clock signal even if one of the oscillators fails.

SUMMARY OF THE INVENTION

This invention, a redundant clock source, provides a clock signal that is derived from two oscillators and whose phase is retained if there is a failure of an oscillator that provides the clock signal, thus guaranteeing a continuous clock signal. The ability of the clock source to retain the phase of the clock signal is achieved by passing the oscillator outputs through a resonant filter having a narrow bandwidth. The output of the filter changes relatively slowly even when there is a sudden change in the filter input. Specifically, the phase of the filter output changes slowly in response to a sudden change in the phase of the input. Therefore, the timing of the clock edges that are derived from the clock source changes slowly and the system components can thus follow the slow change in clock edge timing resulting from the temporary loss of an oscillator output within the clock source.

In the preferred embodiment, the waveforms from both oscillators are combined in an analog summer, whose output is applied to the resonant filter. At least one of the oscillator outputs is filtered so as to produce two different inputs waveforms. The waveforms are selected so that, regardless of their relative phase, the summer provides a substantial output at the required oscillator frequency. If one of the oscillators fails, the output of the other oscillator exclusively generates the clock signal until the failed oscillator is replaced. The removal and subsequent introduction of a replacement oscillator result in phase changes at the output of the analog summer. However, as discussed above, the resonant filter prevents this phase change from unduly affecting the phase of the clock signal.

In a second embodiment, a multiplexer is used to choose between the output of a primary oscillator and the output of a redundant oscillator to be passed to the resonant filter. The primary output signal is also applied to a clock output detector, which, in turn, supplies a control signal input to the multiplexer. If the detector determines that the primary oscillator is working correctly, it controls the multiplexer to choose the primary signal. On the other hand, if the detector senses failure of the primary oscillator, it switches the multiplexer to pass the redundant signal. The primary oscillator can be then replaced, after which the multiplexer again selects the output from the primary oscillator. As discussed above, the resonant filter prevents the switching of the source signal from unduly changing the phase of the clock signal.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
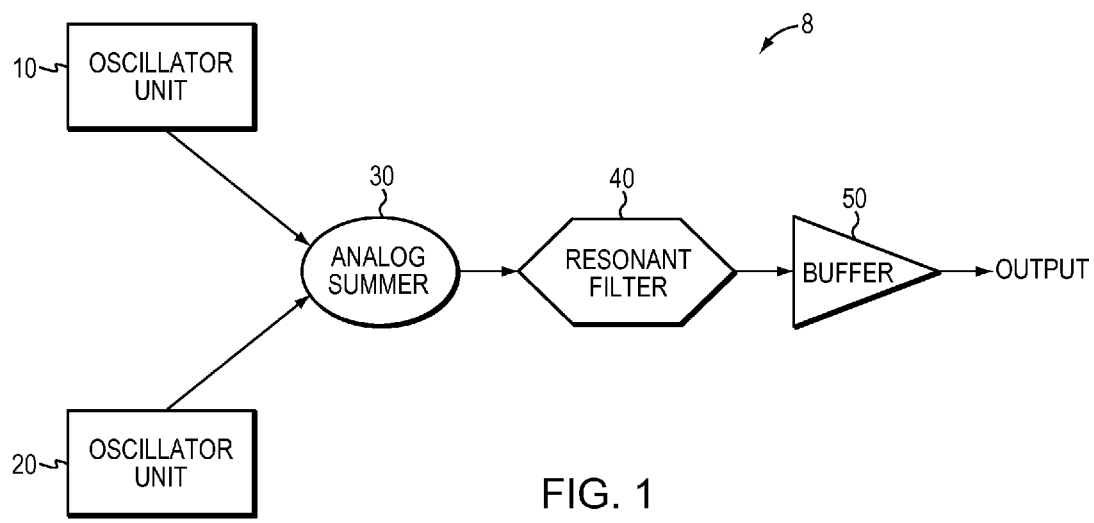
FIG. 1 is a block diagram of the preferred embodiment of the redundant clock source.

As shown in FIG. 1 a redundant clock source 8 includes oscillator units 10 and 20 that nominally operate at the same frequency. The outputs of the oscillator units 10 and 20 are summed by an analog summer 30, whose output is then passed to a resonant filter 40. An output buffer 50 converts the filter output to a square-wave master clock signal. The waveforms produced by oscillator units 10 and 20 are different so that regardless of their relative phases, the summed waveform has a substantial component at the oscillator frequency.

Figure 2:
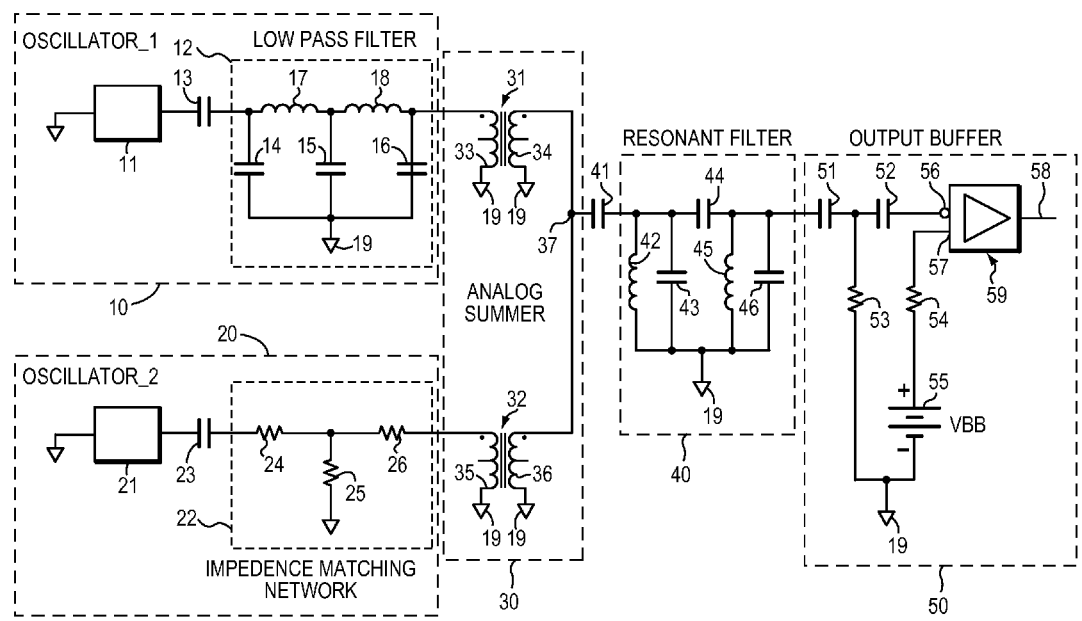
FIG. 2 is a circuit diagram of the preferred embodiment of the redundant clock.

FIG. 2 shows the preferred embodiment of the invention. Oscillator unit 10 comprises a square-wave oscillator 11 and a low pass filter 12 coupled by a DC blocking capacitor 13. The filter 12 comprises series inductors 17 and 18 and shunt capacitors 14, 15 and 16. The values of the capacitors 14, 15 and 16, and the inductors 17 and 18, are such that the output of the filter has a largely sine-wave-like waveform.

The oscillator unit 20 includes a square-wave oscillator 21 and an impedance matching network 22, which is effectively an allpass filter, coupled by a DC blocking capacitor 23. The impedance matching network 22 comprises resistors 24, 25 and 26. Consequently, a square-wave signal is delivered by the network 22 to the summer 30.

The outputs of the oscillator units 10 and 20 are applied to the primary windings 33 and 35 of transformers 31 and 32 respectively, of summer 30. The secondary windings 34 and 36 are connected at a summing junction 37, where the waveforms provided by the filter 12 and network 22 are combined before being passed to the resonant filter 40. Those skilled in the art will recognize that other analog summers may be used without changing the scope of the invention.

The preferred resonant filter 40 is a two-section bandpass filter coupled by a capacitor 44. One section comprises the parallel combination of an inductor 42 and a capacitor 43. The other section comprises the parallel combination of an inductor 45 and a capacitor 46. The resonant filter 40 passes only a narrow band encompassing the nominal oscillator frequency and thus removes unwanted frequency components produced by summer 30. However, the phase of the output of the filter 40 changes relatively slowly even if there is a sudden phase change in signal applied to the filter.

The output buffer 50 uses the signal generated by the resonant filter 40 to construct a clock signal. The buffer 50 comprises an operational amplifier 59, series capacitors 51 and 52, resistors 53 and 54 and a voltage source 55. The voltage source 55 adds a DC component to the analog waveform produced by the resonant filter 60 so that a clock signal with a swing between 0 and a positive voltage is produced by the buffer. Operational amplifier 59 is configured to function as a zero-crossing detector.

Figure 3:
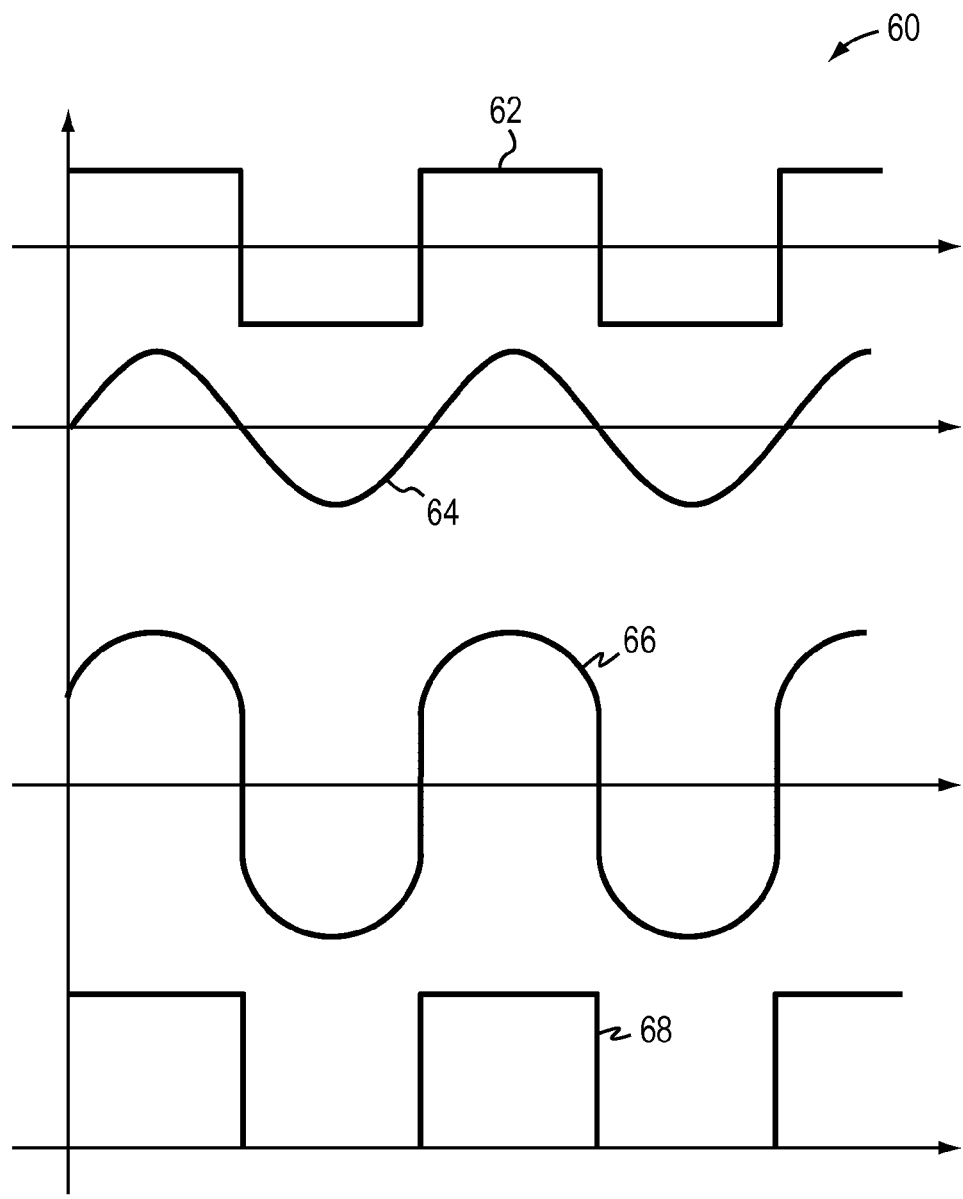
FIG. 3 is an idealized graph showing the first and second waveforms and their sum in the preferred embodiment, the first and second waveforms being in phase.

FIG. 3 illustrates simplified waveforms at various points in the clock source of FIG. 2 when the oscillator 11 and 21 are in phase with each other. The input waveforms 62 and 64 depict the outputs of the network 22 (FIG. 2) and lowpass filter 12 (FIG. 2) The waveform 66 is the sum of the waveforms 62 and 64 at the summing junction 37 (FIG. 2). Waveform 68 represents the a clock signal 68 is produced by the buffer 50 (FIG. 2).

Figure 4:
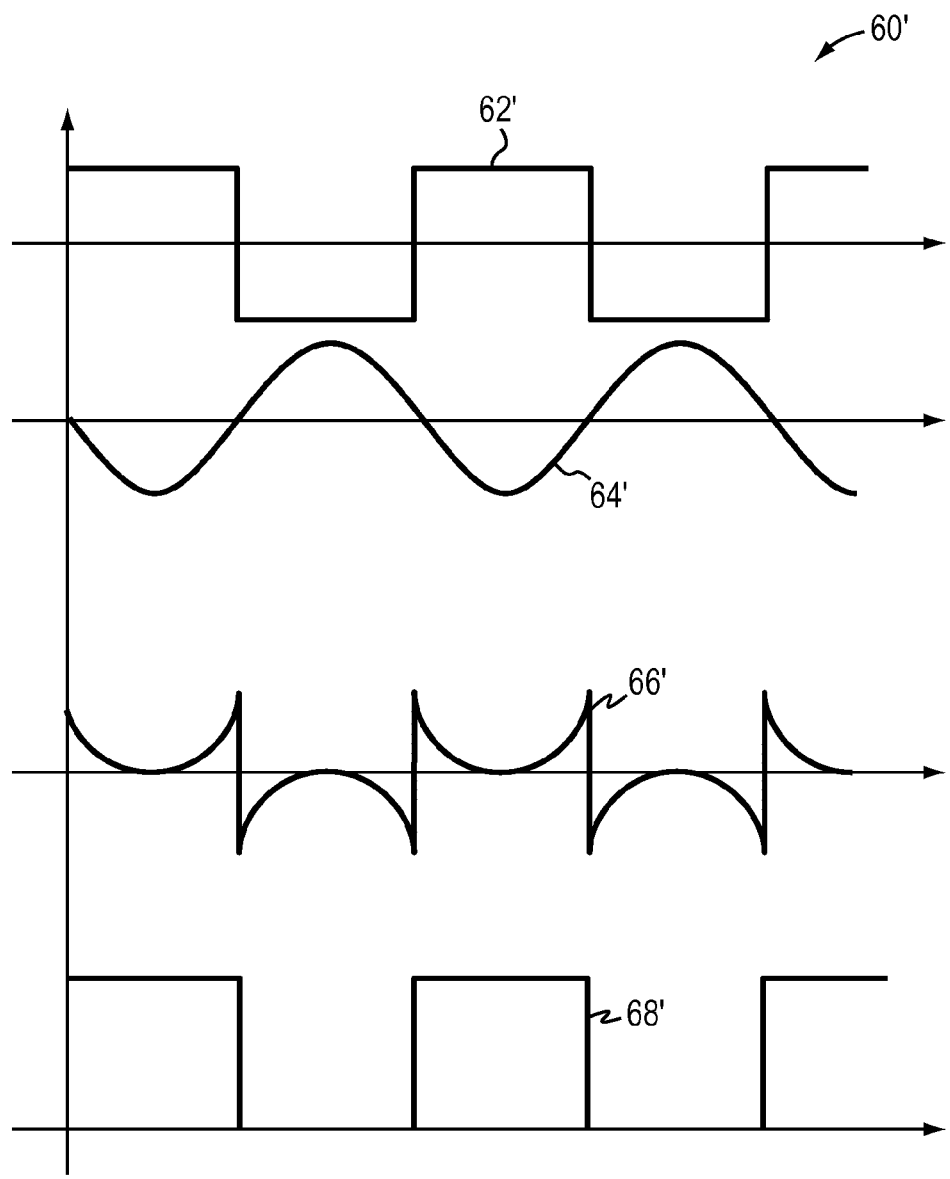
FIG. 4 is an idealized graph showing the first and second waveforms and their sum in the preferred embodiment, the first and second waveforms being 180 degrees out of phase.

FIG. 4 illustrates the corresponding waveforms 62 and 64 when the oscillators are 180 degrees out of phase. The waveform 66', which is the waveforms 62' and 64', clearly includes a substantial component at the frequency of the oscillators 11 and 21 (FIG. 2). Thus the resonant filter 40 (FIG. 2) will selectively pass this component to the buffer 50 (FIG. 2).

If either of the oscillators 11 or 21 (FIG. 2) fails, the summer 30 (FIG. 2) will still apply to the filter 40 (FIG. 2) a signal containing a significant component at the oscillator frequency. There will, in general, be an abrupt change in the phase of that signal. However, the phase of the output of the filter 40 (FIG. 2) will change gradually, so that the phase of the output clock signal changes within the tolerance limits of the circuitry clocked by that signal.

Figure 5:
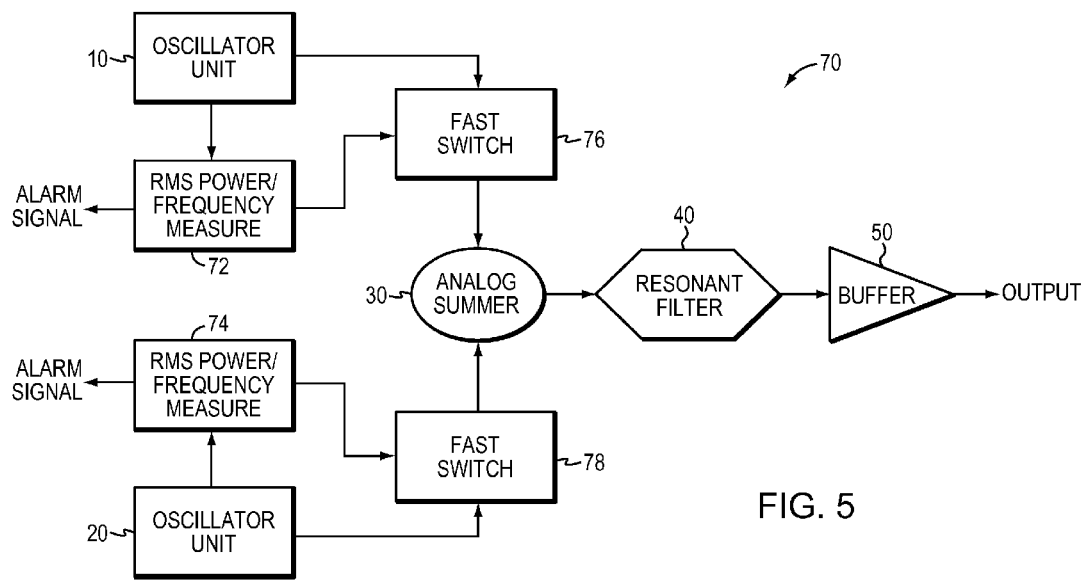
FIG. 5 is a block diagram of a second embodiment of the redundant clock.

Optionally, measurements of the frequency of oscillator units 10 and 20 and the root mean squared voltage of the oscillator unit outputs can be made so as to ensure that the frequency of a particular oscillator does not drift beyond a critical value. FIG. 5 shows RMS Power/Frequency Monitoring Unit 72 and 74 and switches 76 and 78 and their interaction with the preferred embodiment. Unit 72 receives the output of oscillator unit 10. The switch 76 is connected between oscillator unit 10 and summer 30. Monitoring Unit 72 senses divergence beyond a tolerable limit. In such case, a signal is sent to switch 76 to disconnect the oscillator unit 10 from the summer 30, and an alarm signal is sent to the user indicating that the oscillator of the Unit 72 needs to be replaced. Monitoring Unit 74 and switch 78 operate similarly on oscillator unit 20.

Figure 6:
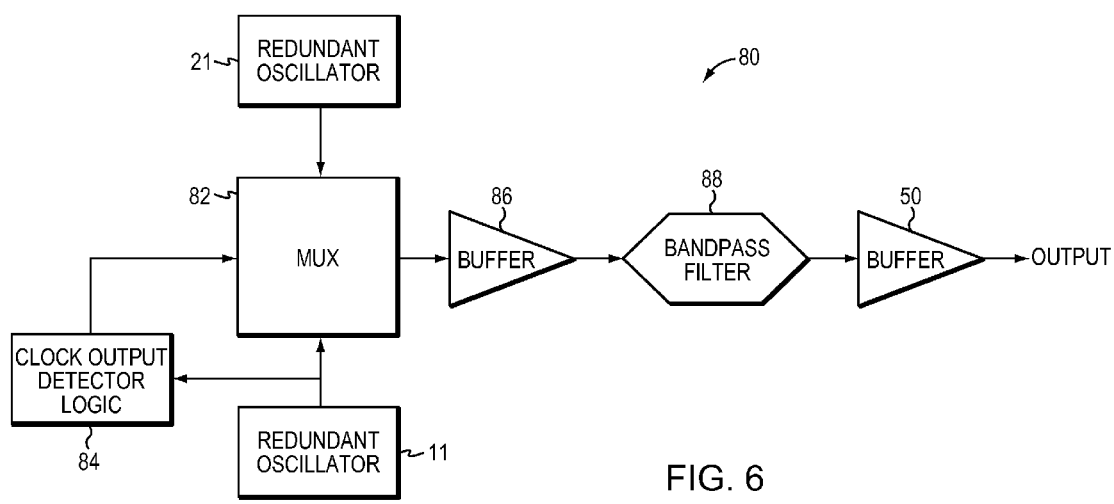
FIG. 6 is a block diagram of yet another embodiment of the invention measure and switching blocks.

FIG. 6 depicts a second embodiment of the invention. This embodiment also has primary and redundant oscillators 11 and 21 connected as alternate inputs to a multiplexer 82. A clock output detector 84 is used to determine from the output of primary oscillator 11 if primary oscillator 11 functions correctly. If primary oscillator 10 functions correctly, detector 84 sends a control signal to the multiplexer 82 to select the primary oscillator 11. If primary oscillator 11 fails, the detector 84 detects the failure and sends a control signal to the multiplexer 82 to choose the redundant oscillator 21. The output of the multiplexer 82 is passed through a buffer 86 before it is passed to resonant filter 88. The resonant filter 88 has a very narrow bandpass filter which responds slowly to phase changes and so the phase change caused by the switching does not cause a disruption to the clock signal output. The Q factor of resonant filter 88 is higher than that of the resonant filter 40 (see FIG. 2) of the preferred embodiment. Buffer 50 is then responsible for generating the clock signal from the clock edges produced by the resonant filter 88.

What is claimed is:

1. A clock system comprising:
    first and second oscillators having the same frequency;
    a circuit for coupling a first waveform derived from said first oscillator and a second waveform derived from said second oscillator to produce a third waveform, said circuit comprising a first filter to receive the output of said first oscilator to produce said first waveform;
    a resonant filter connected to receive said third waveform and generate clock edges; and
    an output buffer connected to receive said clock edges and generate a master clock signal.

2. The clock system of claim 1 in which said circuit further comprises
    a second filter receiving the output of said second oscillator to produce said second waveform, said second waveform being different from said first waveform.

3. The clock system of claim 2 wherein said first filter is an allpass filter and said second filter is a lowpass filter.

4. The clock system of claim 1 in which said circuit further comprises an analog summer for combining said first and second waveforms to produce said third waveform.

5. The clock system of claim 4 wherein said analog summer comprises:
    a first transformer having primary and secondary windings, said primary winding of said first transformer being connected to receive the output of said first filter;
    a second transformer having primary and secondary windings, said primary winding of said second transformer being connected to receive the output of said second filter; and
    a junction connecting said secondary winding to provide said third waveform.

6. A clock system comprising:
    a first oscillator configured to produce a first signal;
    a first filter for converting said first signal to a first waveform;
    a second oscillator configured to produce a second waveform;
    a multiplexer receiving said first and second waveforms as inputs;
    means for choosing an output of said multiplexer from said first and second waveforms;
    a buffer connected to receive a waveform chosen by said means for choosing; and
    a band pass filter connected to said buffer to receive the chosen waveform, the bandpass filter configured to generate a clock signal from the chosen waveform.

7. The clock system of claim 6, said choosing means comprises:
    an oscillation detector receiving the first waveform from said first oscillator and having an output controlling said multiplexer, whereby said multiplexer selects the first waveform from said first oscillator if said detector does not detect a failure in said first oscillator, and selects the second waveform from said second oscillator if said detector detects a failure in said first oscillator.

8. The clock system of claim 6 and further comprising a second filter receiving the output of said second oscillator to produce said second waveform, said second waveform being different from said first waveform.

9. A method of producing a clock signal in a redundant clock system comprising:
    deriving first and second waveforms from a first and second oscillators, said oscillators having a same frequency, wherein said first waveform differs from said second waveform;
    coupling said first and second waveforms to produce a third waveform; and filtering said third waveform with a resonant filter to produce clock edges; and passing said clock edges to an output buffer, said output buffer generating a master clock signal.

10. The method of claim 9 further comprising filtering the output of said first oscillator with an allpass filter and filtering the output of said second oscillator with a lowpass filter.

11. The method of claim 9 further comprising:

passing said first waveform through a first transformer;

passing said second waveform through a second transformer; and connecting said first and second transformers at a junction such that said first and second waveforms are summed to produce said third waveform.

12. A method of producing a clock signal in a redundant clock system comprising:

deriving first and second waveforms from a first and second oscillators, said oscillators having a same frequency, said first waveform being different than said second waveform;

receiving said first and second waveforms as inputs of a multiplexer;

choosing an output of said multiplexer from said first and second waveforms; and passing a waveform chosen by said multiplexer though a resonant filter to produce a third waveform.

13. The method of claim 12 further comprising:

monitoring said first waveform with an oscillation detection logic to control said multiplexer, whereby said multiplexer selects the input from said first oscillator if said oscillation detection logic does not detect a failure in said first oscillator, and selects the input form said second oscillator if said oscillation detection logic detects a failure in said first oscillator.

14. A clock system comprising:

first and second oscillators having the same frequency, the first oscillator producing a first waveform and the second oscillator producing a second waveform, wherein said first waveform is different than said second waveform;

a summer coupled to the first and second oscillators, the summer configured to produce a third waveform from the first and second waveforms;

a resonant filter connected to the summer to receive said third waveform and generate clock edges; and an output buffer connected to receive said clock edges and generate a master clock signal.

* * * * *

UNITED STATES PATENT AND TRADEMARK OFFICE
CERTIFICATE OF CORRECTION

PATENT NO. : 7,397,314 B2  
APPLICATION NO. : 10/241014  
DATED : July 8, 2008  
INVENTOR(S) : Daniel Wissell Page 1 of 1

It is certified that error appears in the above-identified patent and that said Letters Patent is hereby corrected as shown below:

In column 3, lines 3-4, after "represents" delete "the".

In column 3, line 45, delete "a second" and insert -- another --, therefor.

In column 4, line 5, in Claim 1, delete "oscilator" and insert -- oscillator --, therefor.

In column 4, line 44, in Claim 6, delete "band pass" and insert -- bandpass --, therefor.

In column 6, line 8, in Claim 13, delete "form" and insert -- from --, therefor.

Signed and Sealed this

Second Day of December, 2008

JON W. DUDAS  
*Director of the United States Patent and Trademark Office*